(12) United States Patent
Worledge

(10) Patent No.: US 8,750,033 B2
(45) Date of Patent: Jun. 10, 2014

(54) READING A CROSS POINT CELL ARRAY

(71) Applicant: International Business Machines Corporation, Armonk, NY (US)

(72) Inventor: Daniel Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/689,953

(22) Filed: Nov. 30, 2012

(65) Prior Publication Data

US 2014/0126282 A1      May 8, 2014

Related U.S. Application Data

(63) Continuation of application No. 13/669,739, filed on Nov. 6, 2012.

(51) Int. Cl.
*G11C 11/00* (2006.01)

(52) U.S. Cl.
USPC ............ 365/158; 365/148; 365/171; 977/935

(58) Field of Classification Search
USPC ......... 365/48, 55, 62, 66, 74, 78, 80–93, 100, 365/130, 131, 148, 158, 171–173, 225.5, 365/243.5; 216/22; 257/421, E21.665; 438/3; 428/810–816, 817–825.1, 826; 977/933–935
See application file for complete search history.

(56) References Cited

U.S. PATENT DOCUMENTS

| | | | |
|---|---|---|---|
| 6,385,082 B1 | 5/2002 | Abraham et al. | |
| 6,535,416 B1 | 3/2003 | Daughton et al. | |
| 6,704,220 B2 | 3/2004 | Leuschner | |
| 6,778,429 B1 * | 8/2004 | Lu et al. | 365/158 |
| 6,816,405 B1 * | 11/2004 | Lu et al. | 365/171 |
| 6,822,278 B1 | 11/2004 | Koutny | |
| 6,912,152 B2 * | 6/2005 | Iwata et al. | 365/158 |
| 6,980,468 B1 | 12/2005 | Ounadjela | |
| 7,038,942 B2 | 5/2006 | Ohmori | |

(Continued)

FOREIGN PATENT DOCUMENTS

CN           101064184 A      10/2007

OTHER PUBLICATIONS

J.M. Daughtont et al., "Design of Curie Point Written Magnetoresistance Random Access Memory Cells"; Journal. Appl. Phys., vol. 93, No. 10; May 15, 2003; 4 pages.

(Continued)

*Primary Examiner* — Harry W Byrne
(74) *Attorney, Agent, or Firm* — Cantor Colburn LLP; Vazken Alexanian

(57) ABSTRACT

A mechanism is provided for reading a cross point cell array. Voltage biasing is applied to the cross point cell array to determine a state of a target cell on a selected bit line. A negative magnetic field is generated for a selected write bit line corresponding to the target cell. A first current is measured through a selected word line responsive to the negative magnetic field. A positive magnetic field is generated for the selected write bit line corresponding to the target cell. A second current is measured through the selected word line responsive to the positive magnetic field. The state of the target cell is determined based on the first current relative to the second current.

20 Claims, 8 Drawing Sheets

(56) References Cited

U.S. PATENT DOCUMENTS

| | | | |
|---|---|---|---|
| 7,154,798 B2* | 12/2006 | Lin et al. | 365/209 |
| 7,177,178 B2 | 2/2007 | Daughton et al. | |
| 7,310,265 B2 | 12/2007 | Zheng et al. | |
| 7,349,243 B2 | 3/2008 | Lin et al. | |
| 7,436,698 B2* | 10/2008 | Lin et al. | 365/158 |
| 7,443,718 B2 | 10/2008 | Ito et al. | |
| 7,499,314 B2 | 3/2009 | Yang et al. | |
| 7,505,347 B2 | 3/2009 | Rinerson et al. | |
| 7,646,627 B2 | 1/2010 | Hidaka | |
| 7,839,710 B2 | 11/2010 | Kam et al. | |
| 7,923,812 B2 | 4/2011 | Scheuerlein | |
| 7,932,513 B2 | 4/2011 | Hosotani et al. | |
| 8,004,881 B2 | 8/2011 | Zhu et al. | |
| 8,031,519 B2 | 10/2011 | Javerliac et al. | |
| 8,064,245 B2 | 11/2011 | Prejbeanu | |
| 8,169,815 B2 | 5/2012 | Javerliac et al. | |
| 8,208,295 B2 | 6/2012 | Dieny | |
| 2001/0028578 A1 | 10/2001 | Cunningham et al. | |
| 2003/0161197 A1* | 8/2003 | Iwata et al. | 365/200 |
| 2004/0125673 A1 | 7/2004 | Daughton et al. | |
| 2004/0240265 A1* | 12/2004 | Lu et al. | 365/171 |
| 2005/0243598 A1* | 11/2005 | Lin et al. | 365/158 |
| 2007/0091672 A1* | 4/2007 | Lin et al. | 365/158 |
| 2007/0247900 A1 | 10/2007 | Lin et al. | |
| 2007/0253244 A1 | 11/2007 | Wu et al. | |
| 2010/0173488 A1 | 7/2010 | Van Schaijk et al. | |
| 2010/0208516 A1 | 8/2010 | Javerliac et al. | |
| 2011/0058409 A1 | 3/2011 | Chen et al. | |
| 2011/0242885 A1 | 10/2011 | Kim | |
| 2011/0273930 A1 | 11/2011 | Chang et al. | |
| 2012/0120718 A1 | 5/2012 | Lou et al. | |

OTHER PUBLICATIONS

Yiran Chen et al. "A 130 nm 1.2 V/3.3 V 16 Kb Spin-Transfer Torque Random Access Memory with Nondestructive Self-Reference Sensing Scheme," IEEE Journal of Solid-State Circuits, vol. 47, No. 2, Feb. 2012; 14 pages.

Jiale Liang et al., "Cross-Point Memory Array Without Cell Selectors—Device Characterisitics and Data Storage Pattern Dependencies," IEEE Transactions on Electron Devices, vol. 57, No. 10, Oct. 2010; 8 pages.

T.M. Maffitt et al., "Design Considerations for MRAM" IBM J. Res. & Dev.; vol. 50 No. 1; Jan. 2006; 15 pages.

Elaine Ou et al., "Array Architecture for a Nonvolatile 3-Dimensional Cross-Point Resistance-Change Memory," IEEE Journal of Solid-State Circuits, vol. 46, No. 9, Sep. 2011; 13 pages.

Daniel C. Worledge; U.S. Appl. No. 13/669,739, filed Nov. 6, 2012, Entitled: Reading A Cross Point Cell Array, pp. 1-38.

Daniel C. Worledge, U.S. Appl. No. 13/670,148, filed Nov. 6, 2012, Entitled: Magnetoresistive Random Access Memory, pp. 1-28.

Daniel C. Worledge, U.S. Appl. No. 13/689,102, filed Nov. 29, 2012, Entitled: Magnetoresistive Random Access Memory, pp. 1-26.

* cited by examiner

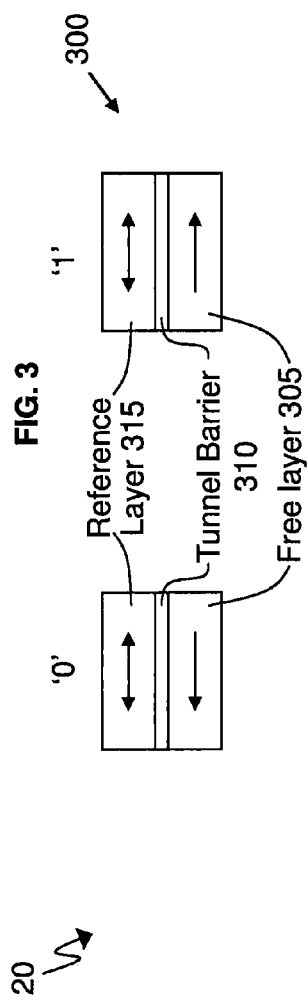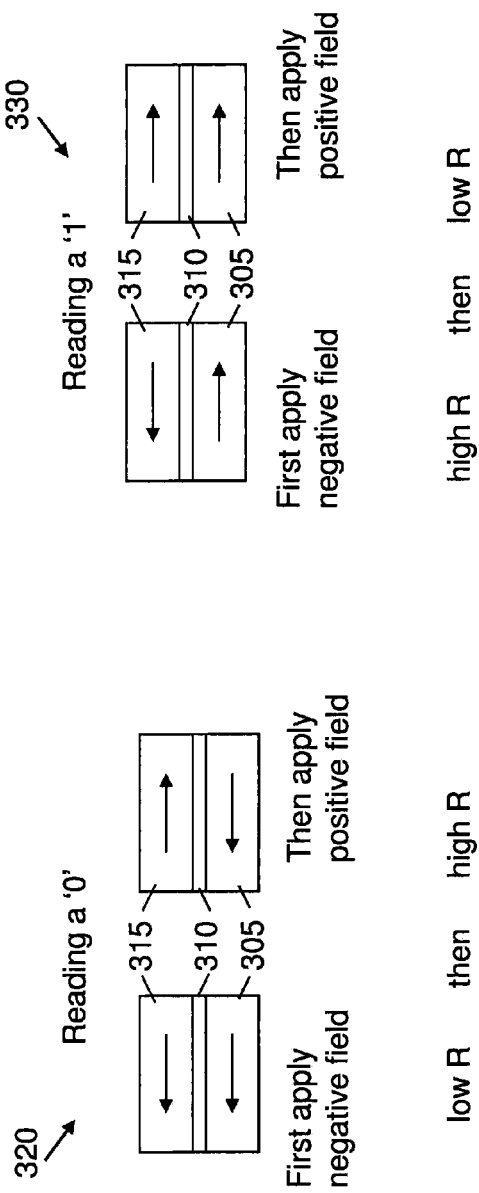
FIG. 3

FIG. 4   Reading a cross point array with bias + self-reference $$MR_{eff} = \frac{MR}{1 + (m-1)(1+MR)\frac{V_{error}}{V}}$$

US 8,750,033 B2

READING A CROSS POINT CELL ARRAY

CROSS-REFERENCE TO RELATED APPLICATIONS AND PRIORITY CLAIM

This application is a continuation of U.S. Non-Provisional application Ser. No. 13/669,739, entitled "READING A CROSS POINT CELL ARRAY", filed Nov. 6, 2012, which is incorporated herein by reference in its entirety.

BACKGROUND

The present invention relates generally to integrated circuit devices and, more specifically to a cross point cell array circuit, and reading the cross point cell array.

Magnetoresistive random access memory (MRAM) is a non-volatile computer memory (NVRAM) technology. Unlike conventional RAM chip technologies, MRAM data is not stored as electric charge or current flows, but by magnetic storage elements. The elements are formed from two ferromagnetic plates, each of which can hold a magnetic moment, separated by a thin insulating layer. One of the two plates is a reference magnet set to a particular polarity; the other plate's field can be changed to match that of an external field to store memory and is termed the "free magnet" or "free-layer". This configuration is known as a magnetic tunnel junction and is the simplest structure for a MRAM bit. A memory device is built from a grid of such "cells".

One method of reading is accomplished by measuring the electrical resistance of the cell. A particular cell is (typically) selected by powering an associated transistor which switches current from a supply line through the cell to ground. Due to the magnetic tunnel effect, the electrical resistance of the cell changes due to the orientation of the magnetization in the two plates. By measuring the resistance of any particular cell, the direction of magnetization of the writable plate can be determined.

SUMMARY

According to one embodiment, a method for reading a cross point cell array is provided. The method includes voltage biasing the cross point cell array to determine a state of a target cell on a selected bit line, generating a negative magnetic field for a selected write bit line corresponding to the target cell, and measuring a first current through a selected word line responsive to the negative magnetic field. Also, the method includes generating a positive magnetic field for the selected write bit line corresponding to the target cell, measuring a second current through the selected word line responsive to the positive magnetic field, and determining the state of the target cell based on the first current relative to the second current.

According to one embodiment, a computer program product for reading a cross point cell array is provided. The computer program product includes a computer readable storage medium having program code embodied therewith, and the program code is executable by a processing circuit to perform a method. The method includes voltage biasing the cross point cell array to determine a state of a target cell on a selected bit line, generating a negative magnetic field for a selected write bit line corresponding to the target cell, and measuring a first current through a selected word line responsive to the negative magnetic field. Also, the method includes generating a positive magnetic field for the selected write bit line corresponding to the target cell, measuring a second current through the selected word line responsive to the positive magnetic field, and determining the state of the target cell based on the first current relative to the second current.

According to one embodiment, a system for reading a cross point cell array is provided. The system includes a processing circuit that operates the cross point cell array. The processing circuit is configured for voltage biasing the cross point cell array to determine a state of a target cell on a selected bit line, generating a negative magnetic field for a selected write bit line corresponding to the target cell, and measuring a first current through a selected word line responsive to the negative magnetic field. Also, the processing circuit is configured for generating a positive magnetic field for the selected write bit line corresponding to the target cell, measuring a second current through the selected word line responsive to the positive magnetic field, and determining the state of the target cell based on the first current relative to the second current.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 3 illustrates self referencing the tunnel junction according to an embodiment.

DETAILED DESCRIPTION

The cross point array is a scheme used for fabricating dense MRAM. However, reading the memory cells (e.g., tunnel junction elements) in the cross point cell array has proved to be difficult, as attempting to bias the array can create problems. Particularly, this has limitations due to small offset voltages (e.g., voltage errors) inherent to the circuit of the cross point cell array.

Accordingly, an embodiment combines two features which include (voltage) biasing the cross point cell array and self reference, in a particular technique as disclosed herein. Voltage bias is used to select one word line (which is the opposite of what is conventionally done). Self reference is used to select one bit line via a write bit line. The end result is that the state of the bit (i.e., memory cell or target cell/bit) at the intersection of the word and bit lines can be sensed (determined), even with the offset voltages inherent to the cross point array circuit.

Figure 1:
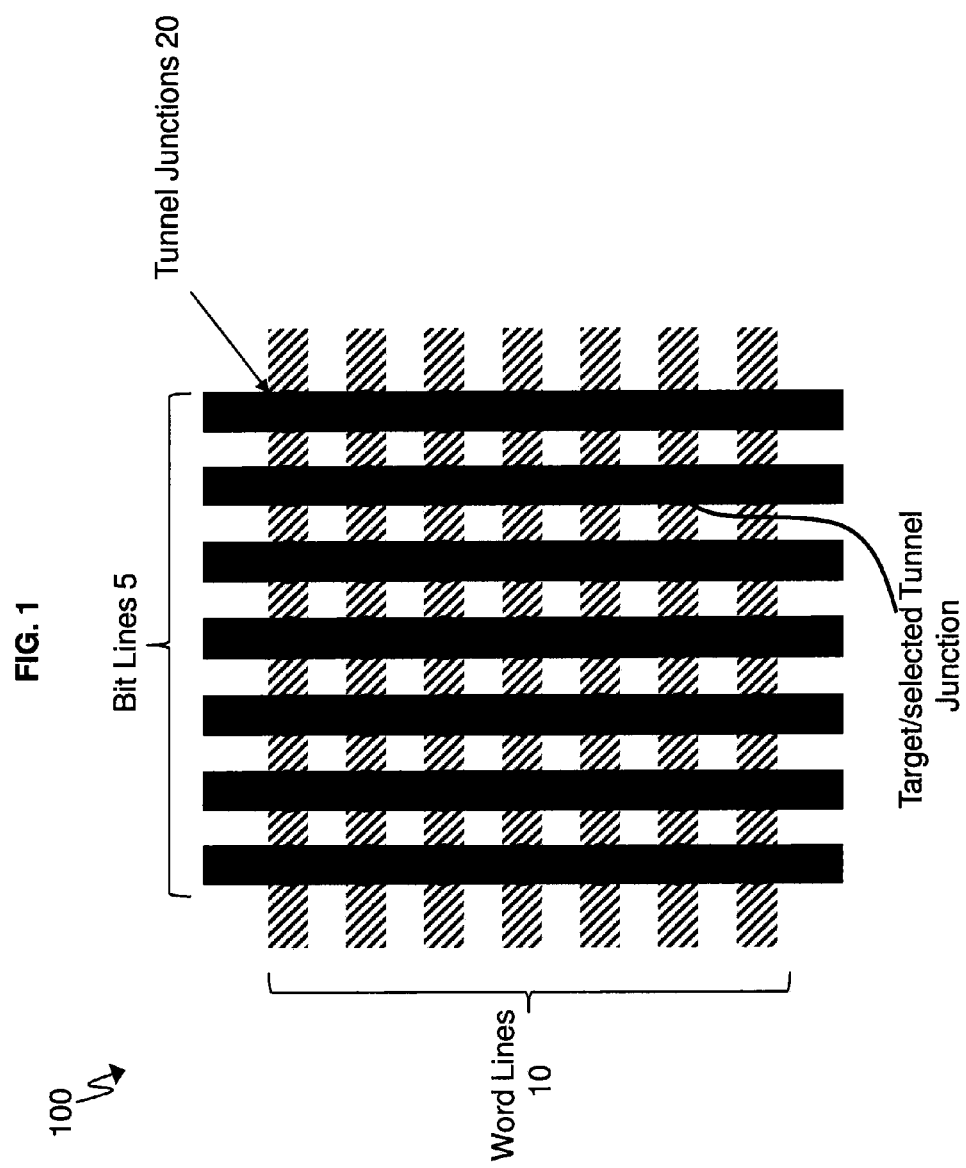
FIG. 1 is a top view of a circuit for a cross point cell array according to an embodiment.

Turning now to the figures, FIG. 1 is a top view of a circuit for a cross point cell array 100 according to an embodiment. The cross point cell array 100 includes bit lines 5 as columns (e.g., 1 through "m" columns) and word lines 10 as rows (e.g., 1 though "n" rows). The bit lines 5 and word lines 10 may be metal wires. Tunnel junctions 20, which are the memory cells or memory bits, are disposed at the intersection of each bit line 5 and word line 10. The tunnel junctions 20 are sandwiched between the bit lines 5 (on top) and the word lines 10 (on the bottom) at their intersections (as shown in FIG. 2).

Figure 2:
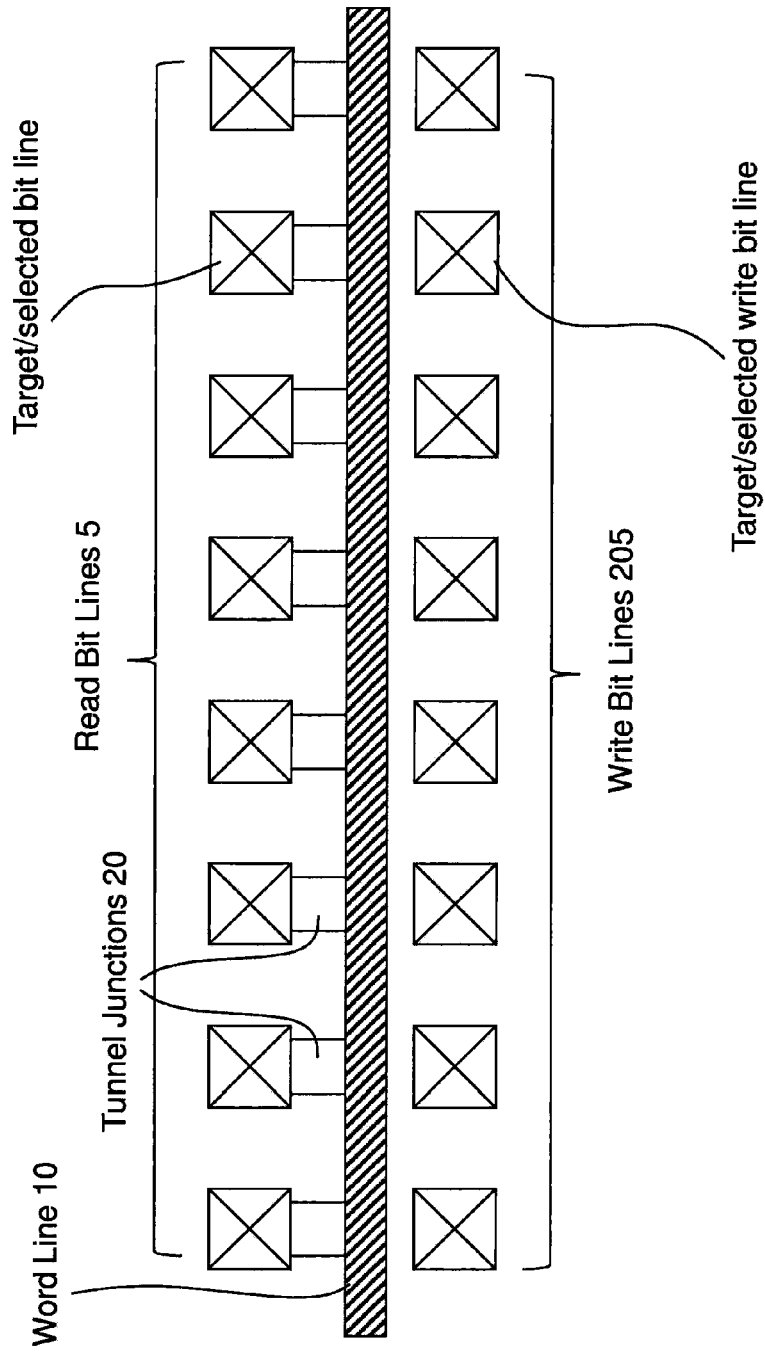
FIG. 2 is a cross-sectional view of the cross point cell array according to an embodiment.

FIG. 2 is a cross-sectional view of the cross point cell array 100 circuit. FIG. 2 illustrates the cross point cell layout with self reference. Self reference is the process of using the tunnel junction 20 itself to determine the state (e.g., high or low) of the tunnel junction 20 based on switching the resistance of the tunnel junction twice to determine the initial resistance (i.e., the initial state).

In the cross-sectional view, the word line 10 has respective tunnel junctions 20 electrically connected on top. Each tunnel junction 20 is electrically connected to a bit line 5. A write bit line 205 is underneath each of the tunnel junctions 20, where a particular write bit line 205 corresponds to an individual bit line 5 in a parallel direction running in and out of the page. The write bit lines 205 are not electrically connected to the word lines 10, the bit lines 5, or the tunnel junctions 20. The "X" on the bit lines 5 (i.e., read bit lines) and write bit lines 205 indicates that the bit lines 5 and write bit lines 205 run in and out of the page in FIG. 2. Particularly, the "X" represents wires running in and out of the page.

Passing an electrical current (via a voltage source 705 in FIG. 7) into (the page) one of the write bit lines 205 generates a magnetic field (to the right). The magnetic field affects all tunnel junctions 20 in the particular bit line 5 right above the particular write bit line 205 that generated the magnetic field. Each write bit line 205 can be individually controlled and operated by a processing circuit 720 in FIG. 7.

FIG. 3 illustrates self referencing the tunnel junction 20 and shows further details of the tunnel junction 20. View 300 shows that each tunnel junction 20 includes a free layer 305, a tunnel barrier 310, and a reference layer 315. The tunnel barrier 310 may be a thin insulator such as MgO or AlOx. The free and reference layers may be a material containing at least one of Fe, Co, Ni, for example CoFeB or CoFe or NiFe. The free and reference layers may further be comprised of a synthetic antiferromagnetic layer, which is a trilayer containing two magnetic layers, such as CoFe or CoFeB, sandwiched around a thin nomagnetic metal layer, for example Ru. Furthermore the free layer may also contain an antiferromagnet, for example IrMn or FeMn, as used in thermally assisted MRAM.

In the self reference junction, which is the tunnel junction 20, to write to the free layer 305, heat is needed to destabilize the free layer 305 and then the magnetic field is generated to write the free layer 305. This changes the magnetic orientation of the free layer 305, e.g., from right to left or from left to right.

In view 300, a left magnetic orientation (i.e., arrow pointing left) for the free layer 305 means a logical 0. Also, in view 300, a right magnetic orientation (arrow pointing right) for the free layer 305 means a logical 1. The resistance is measured across the tunnel junction 20. The representation of the logical 0 and logical 1 may be set to correspond with either direction as desired. For further discussion regarding a cross point cell read scheme using biasing reference can be made to "Design Considerations For MRAM" in IBM J. Res. & Dev. Vol. 50 No. 1, January 2006, by T. M. Maffitt et al., which is herein incorporated by reference in its entirety.

View 320 shows an example of reading a logical 0, while view 330 shows an example of reading a logical 1 in FIG. 3. When the magnetic orientation of the free layer 305 and the reference layer 315 are pointing in the same direction, the free layer 305 and the reference layer 315 are parallel, and the resistance is low (such as e.g., 10,000 ohms). When the magnetic orientation of the free layer 305 and the reference layer 315 are pointing in opposite directions, the free layer 305 and the reference layer 315 are antiparallel, and the resistance is high (such as e.g., 20,000 ohms).

In view 320 for reading a logical 0, a negative magnetic field is applied via the write bit line 205 (selected by the processing circuit 720), which causes the magnetic orientation of both the free layer 305 and the reference layer 315 to point in the same direction, which is the left. The negative magnetic field changes (flips) the magnetic orientation of the reference layer 315 such that the reference layer 315 and free layer 305 are now parallel. The negative magnetic field (the positive magnetic field) does not flip the free layer 305 because no heat was applied to destabilize the free layer 305. A low resistance of the tunnel junction 20 is measured when the reference layer 315 and free layer 305 are parallel. Next, a positive magnetic field is applied via the same write bit line 205 (selected by the processing circuit 720), which causes the magnetic orientation of the free layer 305 and the reference layer 315 to point in opposite directions. The positive magnetic field changes (flips) the magnetic orientation of the reference layer 315 such that the reference layer 315 and free layer 305 are now antiparallel. The magnetic orientation of the reference layer 315 points to the right while the free layer still points to the left. A high resistance of the tunnel junction 20 is measured when the reference layer 315 and free layer 305 are antiparallel. In view 320, a logical 0 is read (by the processing circuit 720) when the resistance of the tunnel junction 20 changes from low resistance to high resistance. During writing, when the magnetic field is applied to write the free layer, the reference layer will also switch; however there is no concern about which direction the reference layer is pointing during writing, because when the tunnel junction is read, one would apply fields as described above to control the direction of the reference layer.

In view 330 for reading a logical 1, a negative magnetic field is applied via the write bit line 205 (selected by the processing circuit 720) and the magnetic orientation the free layer 305 is to the right while the reference layer 315 is pointing to the left. The negative magnetic field changes (flips) the magnetic orientation of the reference layer 315 such that the reference layer 315 and free layer 305 are now antiparallel. A high resistance of the tunnel junction 20 is measured when the reference layer 315 and free layer 305 are antiparallel. Next, a positive magnetic field is applied via the write bit line 205 (selected by the processing circuit 720), and the magnetic orientation of both the free layer 305 and the reference layer 315 are pointing in the same direction. The positive magnetic field changes (flips) the magnetic orientation of the reference layer 315 such that the reference layer 315 and free layer 305 are now parallel. The magnetic orientation of the reference layer 315 points to the right while the free layer 305 still points to the right. A low resistance of the tunnel junction 20 is measured when the reference layer 315 and free layer 305 are parallel. In view 330, a logical 1 is read (by the processing circuit 720) when the resistance of the tunnel junction 20 changes from high resistance to low resistance.

Figure 4:
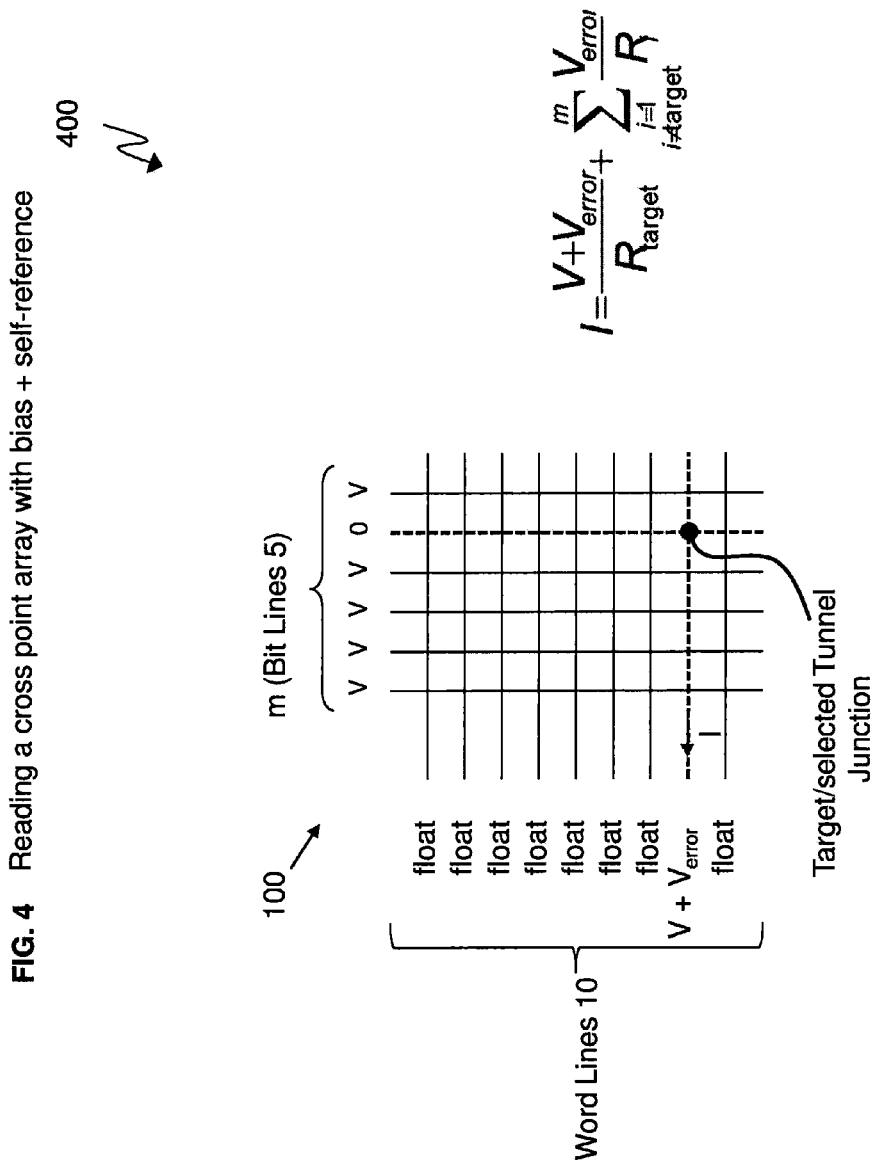
FIG. 4 is a logical view of the circuit for the cross point cell array utilizing both voltage biasing and self reference.

FIG. 4 illustrates a logical view 400 of the circuit for the cross point array cell 100. FIG. 4 illustrates how to read the circuit of the cross point cell array 100 by utilizing the combination of both voltage bias (V) and self reference as disclosed herein.

First, assume a case in which the combination of voltage bias and self reference are not utilized but instead only voltage bias is utilized. In this case, the circuit cannot exactly apply voltage V while also measuring current (I) because of error voltage $V_{error}$ (which may be an offset voltage). This is an understood problem with the cross point cell read. With respect to this case, consider the following equation:

$$I = \frac{V + V_{error}}{R_{target}} + \sum_{\substack{i=1 \\ i \neq target}}^{m} \frac{V_{error}}{R_i} \quad \text{(Equation 1)}$$

In Equation 1, I is current, V is the applied voltage, $V_{error}$ is the error voltage in the cross point array, $R_{target}$ is the resistance of the target cell (memory cell, i.e., target tunnel junction 20) that is being read, "i" is the other cells (i.e., other/unselected tunnel junctions 20) on the same row as the target cell, m is the number of columns, and $R_i$ is resistance of the other cells.

Small error currents (from $V_{error}$) in many different nodes (i.e., cells) add up to a larger problem that causes the measured current I to be incorrect/off, and thus the individual state of the desired tunnel junction cannot be determined in this case.

Despite the best efforts of circuit designers, state of the art circuits will not be able to apply exactly the same voltage V to both the selected word line and the unselected bit lines. There will always be a small error voltage, $V_{error}$, of about 1-3 mV. Hence each of the unselected junctions on the same row as the selected junction has a voltage $V_{error}$ across them. This induces a small current $V_{error}/R_i$ through each of them. These currents add up in the word line and change the value of the current that is measured coming out of the word line. Even though $V_{error}$ is small, and so each error current, $V_{error}/R_i$, is small, the total can be large, since there are so many (m) junctions on the same word line.

Unlike the case above, the embodiment addresses this problem by utilizing a combination of voltage biasing and self reference. The voltage bias technique and the self reference are applied orthogonally. The voltage bias (V) is utilized to select the selected word line 10 (opposite of usual) and self reference is utilized to select (isolate) the selected bit line. The selected word line 10 and selected bit line are shown with dashed lines in FIG. 4. Only $R_{target}$ (i.e., the resistance of the target tunnel junction 20) changes during self reference, while the error currents are a constant background.

Figure 5:
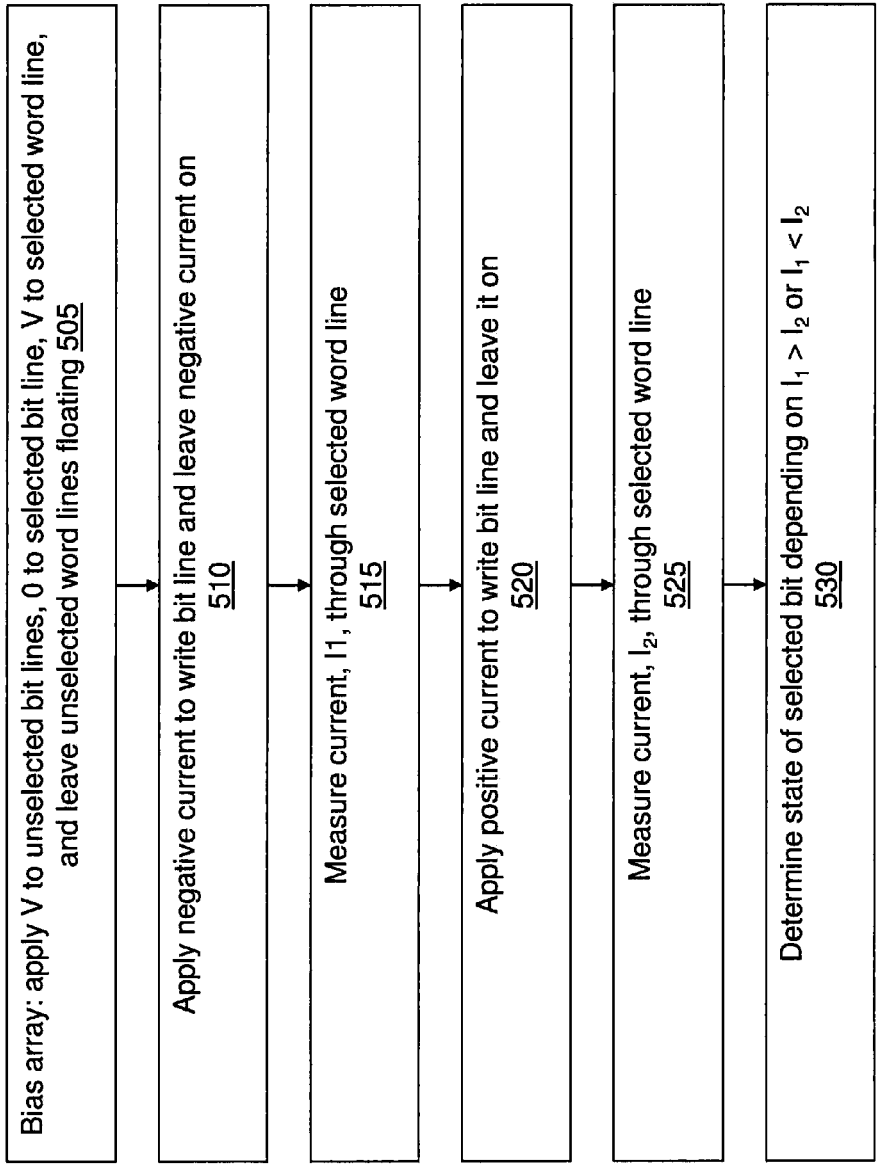
FIG. 5 illustrates a method for reading the circuit of the cross point cell array utilizing both voltage biasing and self reference according to an embodiment.

The logical view 400 of the circuit for the cross point cell array 100 is explained with the combination of voltage biasing and self reference. Particularly, FIG. 5 illustrates a method 500 (executed by the processing circuit 720) for reading the circuit of the cross point cell array 100 utilizing voltage biasing and self reference. Reference can be made to FIGS. 1-4, 7, and 8).

The processing circuit 720 is configured to voltage bias the circuit of the cross point cell array 100 by: applying voltage V to unselected bit lines, applying 0 volts to the selected bit line 5 having the target tunnel junction 20 to be read, applying voltage V to the selected word line having the target tunnel junction 20 to be read, and leaving the unselected word lines floating (i.e., leaving the unselected word lines open with no voltage applied) at block 505. Floating the unselected word lines 10 means they are not connected to any voltage source or ground. In FIG. 4, only the selected bit line 5 and selected word line 10 have dashed lines.

At block 510, processing circuit 720 is configured to apply a negative current (via current source 707 in FIG. 7) to the selected write bit line 205 corresponding to selected bit line 5 having the target tunnel junction 20, and negative current is left powered on, such that a negative magnetic field is generated for the bit line 5 having the target tunnel junction 20. The processing circuit 720 is configured to select the selected write bit line 205 shown in FIG. 2.

Once the negative magnetic field is generated by the negative current to flip the reference layer 315, the processing circuit 720 is configured to measure a first current $I_1$ through the selected word line (via a current meter 710 in FIG. 7) at block 515.

At block 520, processing circuit 720 is configured to apply a positive current (via current source 707 in FIG. 7) to the selected write bit line 205 corresponding to selected bit line 5 having the target tunnel junction 20, and the positive current is left powered on, such that a positive magnetic field is generated for the selected bit line 5 having the target tunnel junction 20.

Once the positive magnetic field is generated by the positive current to flip the reference layer 315, the processing circuit 720 is configured to measure the second current $I_2$ through the selected word line (via the current meter 710) at block 525.

At block 530, the processing circuit 720 is configured to determine the state of the target tunnel junction 20 (i.e., the selected bit). When the processing circuit 720 determines that $I_1 > I_2$ this represents a logical 0, and when the processing circuit 720 determines that $I_1 < I_2$ this represents a logical 1.

In the method, the negative magnetic field and the positive magnetic field are respectively generated in the selected write bit line 205 in response to: applying the voltage V to unselected bit lines, applying the zero (0) voltage to the selected bit line having the target tunnel junction 20 (memory cell), applying the voltage V to the selected word line 10 having the target tunnel junction 20, and applying the floating point to the unselected word lines 10 not having the target tunnel junction 20.

The method by the processing circuit 720 includes isolating the target tunnel junction 20 to determine the state of the target tunnel junction by: measuring the first current ($I_1$) at a first resistance state of the target tunnel junction 20, in which the first resistance state occurs by applying the negative magnetic field; measuring the second current at a second resistance state of the target tunnel junction 20, in which the second resistance state occurs by applying the positive magnetic field; where untargeted tunnel junctions 20 (which are not the selected tunnel junction 20) on the selected bit line 5 of the target tunnel junction 20 alternate from the first resistance state to the second resistance state but do not contribute to (affect) the first current ($I_1$) and the second current ($I_2$) for the purpose of determining the state of the target tunnel junction 20; where the untargeted tunnel junction 20 on the selected word line 10 of the target tunnel junction 20 do not alternate from the first resistance state to the second resistance state when the negative magnetic field and the positive magnetic field are applied; and causing a change in the first current ($I_1$) and the second current ($I_2$) to determine the state of the target tunnel junction 20 based on measuring the first current at the first resistance state of the target tunnel junction 20 and measuring the second current at the second resistance state of the target tunnel junction 20.

The cross point cell array 100 comprises a plurality of bit lines 5 in a first direction; a plurality of word lines 10 in a second direction perpendicular to the first direction; a plurality of tunnel junctions 20 (memory cells) at an intersection of the each of the plurality of bit lines 5 and the plurality of word lines 10; and a plurality of write bit lines 205 parallel to the plurality of bit lines 5 in the first direction, in which the plurality of write bit lines 205 are not electrically connected to the plurality of bit lines 5 and word lines 10.

Figure 6:
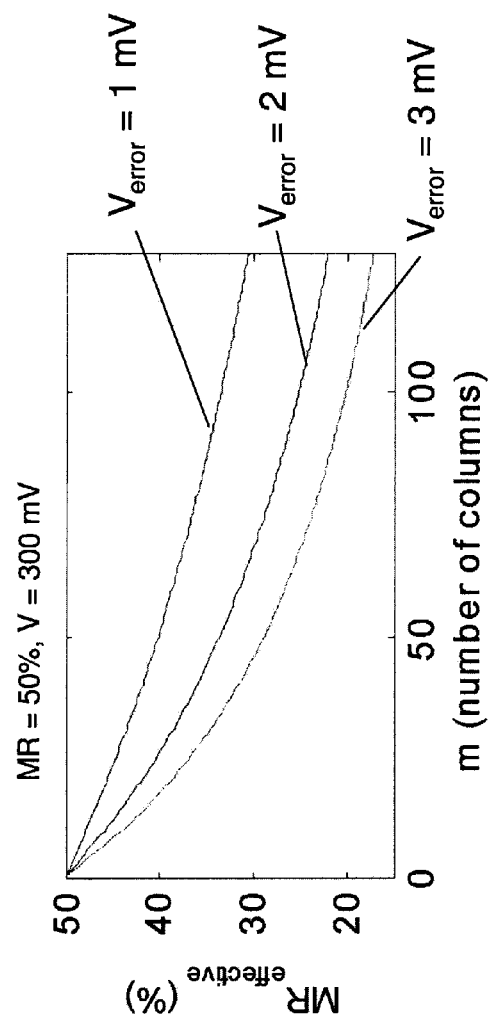
FIG. 6 is a graph showing the read signal versus error voltage according to an embodiment.

FIG. 6 illustrates a graph 600 showing that there is a large read signal achievable even with a modest magnetoresistance (MR) and very large $V_{error}$, as compared to a read signal of less then 5% for a standard scheme (which requires a transistor with a tunnel junction (reference cell). The read signal is $MR_{effective}$ shown in Equation 2 below. The embodiment does not require a transistor connected to each tunnel junction 20 for respectively reading each tunnel junction 20. As such the embodiment eliminates the space required for the transistor per tunnel junction requirement as no transistors need to be utilized in the cross point cell array 100 for targeting an individual tunnel junction 20 to be read.

The following shows a formula for a worst scenario such as all of the other tunnel junctions 20 are in a low resistance state in which Equation 2 follows.

$$MR_{eff} = \frac{MR}{1 + (m-1)(1+MR)\frac{V_{error}}{V}} \quad \text{(Equation 2)}$$

MR of the cross point array is defined as:

[(high resistance−low resistance)/low resistance] *100%  (Equation 3)

In the graph 600, the applied voltage bias V is 300 mV and the MR is 50%. Having the MR=50% can mean that the low resistance of the tunnel junction 20 is 10,000 ohms (Ω) while the high resistance is 15,000 ohms. The calculated $MR_{effective}$ is on the y-axis and the number of columns "m" is shown on the x-axis. As can been seen the MReffective remains above 10% even when the largest Verror=3 mV (millivolts) is used.

Figure 7:
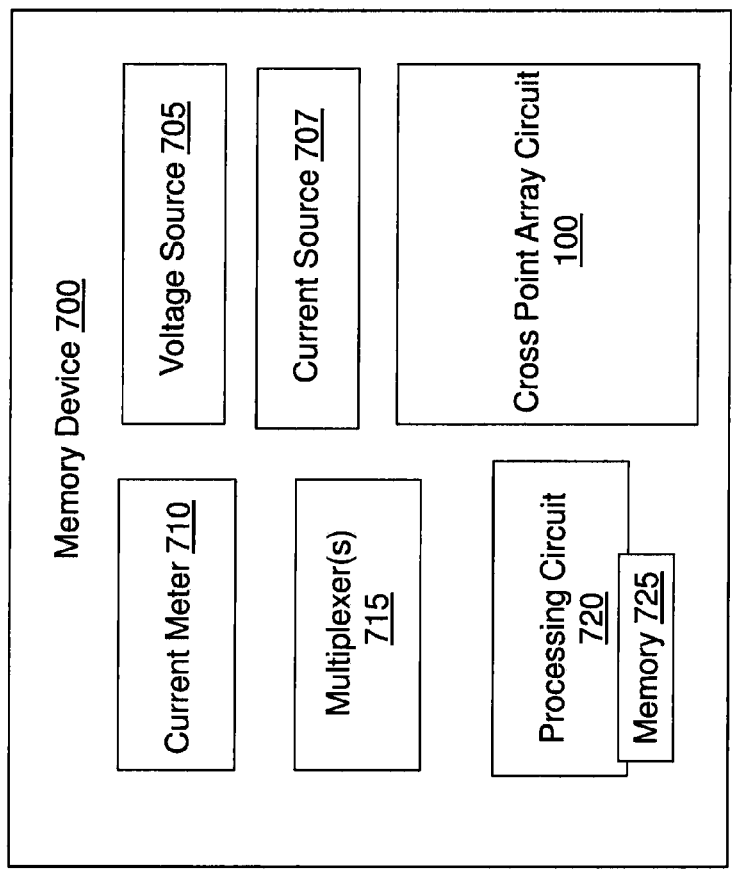
FIG. 7 is a memory device which includes the circuit of the cross point cell array according to an embodiment.

FIG. 7 illustrates a memory device 700 which includes the circuit of cross point cell array 100. The memory device 700 (and the operation of circuit for the cross point cell array 100) is controlled by a memory controller which is a processing circuit 720 as understood by one skilled in the art. The processing circuit 720 may be an application specific integrated circuit (ASIC) for operating the cross point cell array 100 as disclosed herein. Also, the processing circuit 720 can execute instructions stored in memory 725 to operate the cross point cell array 100 as disclosed herein. The processing The memory device 700 includes and/or is operatively connected to one or more voltage sources 705 supplying voltage bias V to the cross point cell array circuit 100 as directed by the processing circuit 720, multiplexers 715 directing signals, current sources 707 supplying electrical current to the write bit lines 205 as directed by the processing circuit 720, and current meters 710 measuring electrical current on the selected word line 10 for targeted tunnel junction 20 as directed by the processing circuit.

Figure 8:
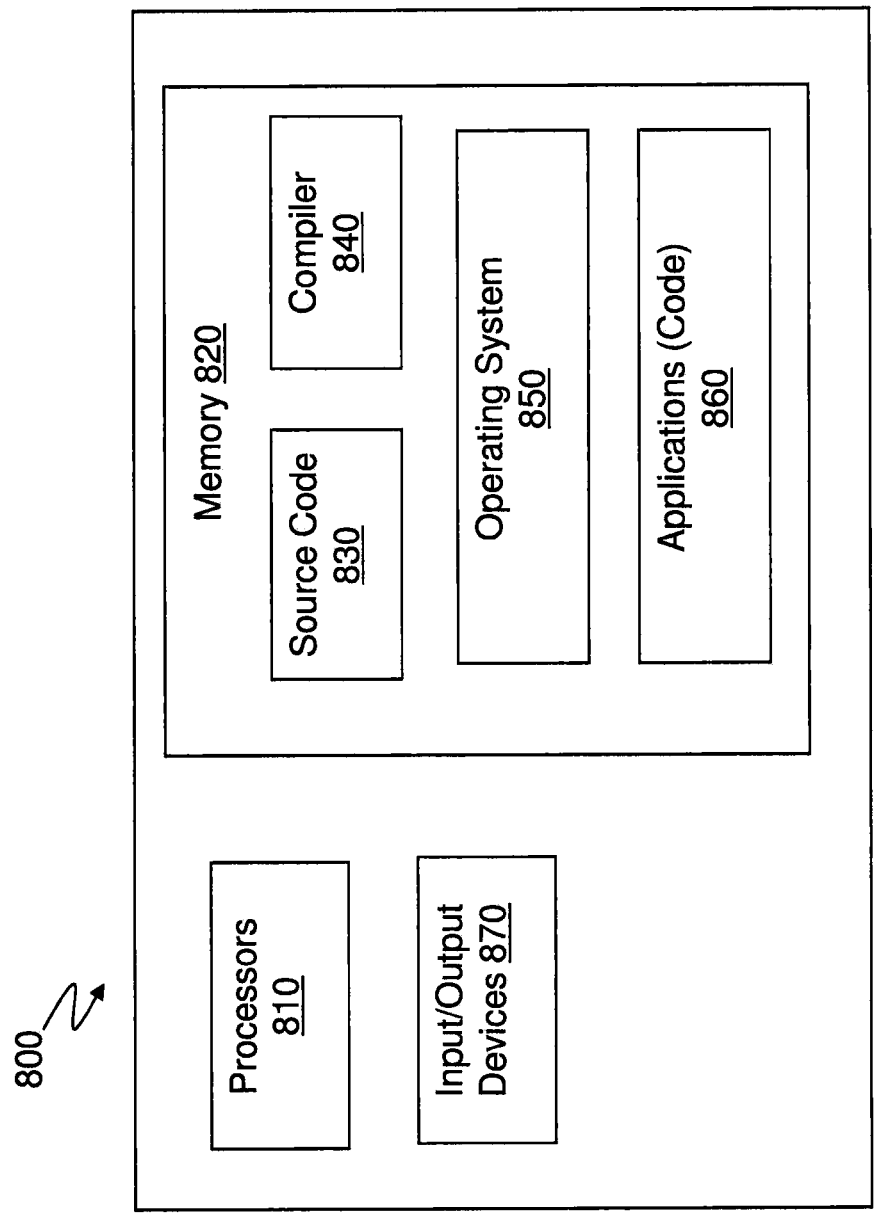
FIG. 8 illustrates an example of a computer which can be connected to and/or operate the cross point cell array according to an embodiment.

FIG. 8 illustrates an example of a computer 800 (which may include the memory device 700 having the cross point cell array 100 to operate the features disclosed herein) having capabilities, which may be included in exemplary embodiments. Various methods, procedures, modules, flow diagrams, tools, applications, circuits, elements, equations, and techniques discussed herein may also incorporate and/or utilize the capabilities of the computer 800. Moreover, capabilities of the computer 800 may be utilized to implement features of exemplary embodiments discussed herein. One or more of the capabilities of the computer 800 may be utilized to implement, to incorporate, to connect to, and/or to support any element discussed herein (as understood by one skilled in the art) in FIGS. 1-7.

Generally, in terms of hardware architecture, the computer 800 may include one or more processors 810, computer readable storage memory 820, and one or more input and/or output (I/O) devices 870 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 810 is a hardware device for executing software that can be stored in the memory 820. The processor 810 can be virtually any custom made or commercially available processor, a central processing unit (CPU), a data signal processor (DSP), or an auxiliary processor among several processors associated with the computer 800, and the processor 810 may be a semiconductor based microprocessor (in the form of a microchip) or a microprocessor.

The computer readable memory 820 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 820 may incorporate electronic, magnetic, optical, and/or other types of storage media. Note that the memory 820 can have a distributed architecture, where various components are situated remote from one another, but can be accessed by the processor 810.

The software in the computer readable memory 820 may include one or more separate programs, each of which comprises an ordered listing of executable instructions for implementing logical functions. The software in the memory 820 includes a suitable operating system (O/S) 850, compiler 840, source code 830, and one or more applications 860 of the exemplary embodiments. As illustrated, the application 860 comprises numerous functional components for implementing the features, processes, methods, functions, and operations of the exemplary embodiments. The application 860 of the computer 800 may represent numerous applications, agents, software components, modules, interfaces, controllers, etc., as discussed herein but the application 860 is not meant to be a limitation.

The operating system 850 may control the execution of other computer programs, and provides scheduling, input-output control, file and data management, memory management, and communication control and related services.

The application 860 may be a source program, executable program (object code), script, or any other entity comprising a set of instructions to be performed. When a source program, then the program is usually translated via a compiler (such as the compiler 840), assembler, interpreter, or the like, which may or may not be included within the memory 820, so as to operate properly in connection with the O/S 850. Furthermore, the application 860 can be written as (a) an object oriented programming language, which has classes of data and methods, or (b) a procedure programming language, which has routines, subroutines, and/or functions.

The I/O devices 870 may include input devices (or peripherals) such as, for example but not limited to, a mouse, keyboard, scanner, microphone, camera, etc. Furthermore, the I/O devices 870 may also include output devices (or peripherals), for example but not limited to, a printer, display, etc. Finally, the I/O devices 870 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 870 also include components for communicating over various networks, such as the Internet or an intranet. The I/O devices 870 may be connected to and/or communicate with the processor 810 utilizing Bluetooth connections and cables (via, e.g., Universal Serial Bus (USB) ports, serial ports, parallel ports, FireWire, HDMI (High-Definition Multimedia Interface), etc.).

When the computer 800 is in operation, the processor 810 is configured to execute software stored within the memory 820, to communicate data to and from the memory 820, and to generally control operations of the computer 800 pursuant to the software. The application 860 and the O/S 850 are read, in whole or in part, by the processor 810, perhaps buffered within the processor 810, and then executed.

When the application 860 is implemented in software it should be noted that the application 860 can be stored on virtually any computer readable storage medium for use by or in connection with any computer related system or method.

The application 860 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 860 is implemented in hardware, the application 860 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It is understood that the computer 800 includes non-limiting examples of software and hardware components that may be included in various devices, servers, and systems discussed herein, and it is understood that additional software and hardware components may be included in the various devices and systems discussed in exemplary embodiments.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A computer program product for reading a cross point cell array, the computer program product comprising a computer readable storage medium having program code embodied therewith, the program code executable by a processing circuit to perform a method comprising:
   voltage biasing the cross point cell array to determine a state of a target cell on a selected bit line;
   generating a negative magnetic field for a selected write bit line corresponding to the target cell;
   measuring a first current through a selected word line responsive to the negative magnetic field;
   generating a positive magnetic field for the selected write bit line corresponding to the target cell;
   measuring a second current through the selected word line responsive to the positive magnetic field; and
   determining the state of the target cell based on the first current relative to the second current.

2. The computer program product of claim 1, wherein voltage biasing the cross point cell array for the target cell comprises:
   applying a voltage to unselected bit lines, applying a zero voltage to the selected bit line having the target cell, applying the voltage to the selected word line having the target cell, and applying a floating point to unselected word lines not having the target cell;
   wherein the floating point is electrically unconnected to a voltage source.

3. The computer program product of claim 1, wherein generating the negative magnetic field for the selected write bit line corresponding to the target cell comprises applying a negative current to the selected write bit line; and
   wherein the negative current remains powered on as the first current is measured.

4. The computer program product of claim 1, wherein generating the positive magnetic field for the selected write bit line corresponding to the target cell comprises applying a positive current to the selected write bit line; and
   wherein the positive current remains powered on as the second current is measured.

5. The computer program product of claim 1, wherein determining the state of the target cell comprises determining when the first current is greater than the second current and when the first current is less than the second current.

6. The computer program product of claim 5, further comprising determining that the state is a logical zero responsive to the first current being greater than the second current.

7. The computer program product of claim 5, further comprising determining that the state is a logical one responsive to the first current being less than the second current.

8. The computer program product of claim 2, wherein the negative magnetic field and the positive magnetic field are respectively generated in the selected write bit line in response to: applying the voltage to unselected bit lines, applying the zero voltage to the selected bit line having the target cell, applying the voltage to the selected word line having the target cell, and applying the floating point to the unselected word lines not having the target cell.

9. The computer program product of claim 1, further comprising isolating the target cell to determine the state of the target cell by:
- measuring the first current at a first resistance state of the target cell, the first resistance state occurring by applying the negative magnetic field;
- measuring the second current at a second resistance state of the target cell, the second resistance state occurring by applying the positive magnetic field;
- wherein untargeted cells on the selected bit line of the target cell alternate from the first resistance state to the second resistance state but do not contribute to the first current and the second current;
- wherein the untargeted cells on the selected word line of the target cell do not alternate from the first resistance state to the second resistance state when the negative magnetic field and the positive magnetic field are applied; and
- causing a change in the first current and the second current to determine the state of the target cell based on measuring the first current at the first resistance state of the target cell and measuring the second current at the second resistance state of the target cell.

10. The computer program product of claim 1, wherein the cross point cell array comprises:
- a plurality of bit lines in a first direction;
- a plurality of word lines in a second direction perpendicular to the first direction;
- a plurality of cells at an intersection of the plurality of bit lines and the plurality of word lines; and
- a plurality of write bit lines parallel to the plurality of bit lines in the first direction, the plurality of write bit lines not being electrically connected to the plurality of bit lines and the plurality of word lines.

11. A system for reading a cross point cell array, the system comprising:
- a processing circuit operating the cross point cell array, the processing circuit configured for:
- voltage biasing the cross point cell array to determine a state of a target cell on a selected bit line;
- generating a negative magnetic field for a selected write bit line corresponding to the target cell;
- measuring a first current through a selected word line responsive to the negative magnetic field;
- generating a positive magnetic field for the selected write bit line corresponding to the target cell;
- measuring a second current through the selected word line responsive to the positive magnetic field; and
- determining the state of the target cell based on the first current relative to the second current.

12. The system of claim 11, wherein voltage biasing the cross point cell array for the target cell comprises:
- applying a voltage to unselected bit lines, applying a zero voltage to the selected bit line having the target cell, applying the voltage to the selected word line having the target cell, and applying a floating point to unselected word lines not having the target cell;
- wherein the floating point is electrically unconnected to a voltage source.

13. The system of claim 11, wherein generating the negative magnetic field for the selected write bit line corresponding to the target cell comprises applying a negative current to the selected write bit line; and
- wherein the negative current remains powered on as the first current is measured.

14. The system of claim 11, wherein generating the positive magnetic field for the selected write bit line corresponding to the target cell comprises applying a positive current to the selected write bit line; and
- wherein the positive current remains powered on as the second current is measured.

15. The system of claim 11, wherein determining the state of the target cell comprises determining when the first current is greater than the second current and when the first current is less than the second current.

16. A method for reading a cross point cell array, the method comprising:
- voltage biasing the cross point cell array to determine a state of a target cell on a selected bit line;
- generating a negative magnetic field for a selected write bit line corresponding to the target cell;
- measuring a first current through a selected word line responsive to the negative magnetic field;
- generating a positive magnetic field for the selected write bit line corresponding to the target cell;
- measuring a second current through the selected word line responsive to the positive magnetic field; and
- determining the state of the target cell based on the first current relative to the second current.

17. The method of claim 16, wherein voltage biasing the cross point cell array for the target cell comprises:
- applying a voltage to unselected bit lines, applying a zero voltage to the selected bit line having the target cell, applying the voltage to the selected word line having the target cell, and applying a floating point to unselected word lines not having the target cell;
- wherein the floating point is electrically unconnected to a voltage source.

18. The method of claim 16, wherein generating the negative magnetic field for the selected write bit line corresponding to the target cell comprises applying a negative current to the selected write bit line; and
- wherein the negative current remains powered on as the first current is measured.

19. The method of claim 16, wherein generating the positive magnetic field for the selected write bit line corresponding to the target cell comprises applying a positive current to the selected write bit line; and
- wherein the positive current remains powered on as the second current is measured.

20. The method of claim 16, wherein determining the state of the target cell comprises determining when the first current is greater than the second current and when the first current is less than the second current.

* * * * *